(12) United States Patent
Berranger

(10) Patent No.: US 6,326,929 B1
(45) Date of Patent: Dec. 4, 2001

(54) METHOD AND DEVICE FOR THE MEASUREMENT OF ANTENNA IMPEDANCE

(75) Inventor: Robert Berranger, Elancourt (FR)

(73) Assignee: Thomson-CSF, Paris (FR)

(*) Notice: Subject to any disclaimer, the term of this patent is extended or adjusted under 35 U.S.C. 154(b) by 0 days.

(21) Appl. No.: 09/643,991

(22) Filed: Aug. 23, 2000

(30) Foreign Application Priority Data

Aug. 24, 1999 (FR) .................................................. 99 10744

(51) Int. Cl.[7] .................................................. G01R 27/02
(52) U.S. Cl. ............................................ 343/703; 343/850
(58) Field of Search ................................. 343/703, 850; 324/637; 455/226

(56) References Cited

U.S. PATENT DOCUMENTS

| 4,027,332 | * | 5/1977 | Wu et al. ............................. 358/139 |
| 4,380,767 | * | 4/1983 | Goldstein et al. .................... 343/745 |
| 4,409,544 | * | 10/1983 | Redlich ............................. 324/57 R |
| 5,157,338 | | 10/1992 | Motherbaugh et al. ............. 324/637 |
| 5,206,600 | | 4/1993 | Moehlmann .......................... 324/650 |

FOREIGN PATENT DOCUMENTS

| 29 31 757 | 2/1981 | (DE) | ................................ H03H/7/38 |
| 197 56 100 A 1 | 10/1998 | (DE) | ............................... G01R/27/02 |
| 10 163889 | 6/1998 | (JP) | ................................. H04B/1/04 |
| WO 96/39727 | 12/1996 | (WO) | ............................... H01Q/1/50 |

* cited by examiner

Primary Examiner—Don Wong
Assistant Examiner—Hoang Nguyen
(74) Attorney, Agent, or Firm—Oblon, Spivak, McClelland, Maier & Neustadt, P.C.

(57) ABSTRACT

The device comprises a current/voltage transformer (1) coupled by its primary winding between a matching device (2) of an antenna (3) and the output of an amplifier (4) for the supply or the antenna (3), a first (5a) and a second (5b) baseband digital frequency transposition device respectively coupled to the output of the amplifier (4) and to the secondary winding of the transformer (1), and a computation device (7) to compute the impedance of the antenna (3) from signals given by the first frequency transposition device (5a) and the second frequency transposition device (5b).

6 Claims, 2 Drawing Sheets

METHOD AND DEVICE FOR THE MEASUREMENT OF ANTENNA IMPEDANCE

BACKGROUND OF THE INVENTION

The present invention relates to a method and a device to measure the impedance of radioelectric antennas carrying out high-frequency transmission in a broad bandwidth.

The use of a broadband antenna in transmission requires the positioning of a matching device between the transmitter and the antenna in order to match the output impedance of the amplifier that powers the antenna with the characteristic impedance of the antenna.

The matching device is usually controlled by successive approximations with checks being made each time on the standing-wave ratio and the phase of the signal at the input of the device. The matching is done when the standing-wave ratio has descended below a given threshold value.

The execution of such a process requires a large number of iterative operations that take time and delay the transmission of the useful signal accordingly.

In addition, the devices implemented to measure the standing-wave ratio are rudimentary and, since they are sized in order to work in broad frequency bands, transmitters that are geographically nearby can always disturb the measurements because of their lack of selectivity.

SUMMARY OF THE INVENTION

The aim of the invention is to mitigate the above-mentioned drawbacks.

To this end, an object of the invention is a method to measure the impedance of an antenna supplied by an amplifier, wherein the method consists of:

- the conversion, into voltage, of the value of the antenna supply current by means of a transformer whose primary winding is crossed by the supply current,
- the uncoupling, in a first step, of the antenna from the amplifier to charge the amplifier on a calibrating resistor Re through the primary winding of the transformer in making the voltage given by the secondary winding equal to the voltage given by the output of the amplifier,
- then the uncoupling, in a second step, of the calibrating resistor Re from the output of the amplifier by reconnecting the antenna to the output of the amplifier through the primary winding of the transformer to compute the modulus and the argument of impedance Z of the antenna through the multiplication, by the value of the calibrating resistor Re, of the ratio of the voltages given respectively during this second step by the output of the amplifier and the secondary winding of the transformer.

An object of the invention is also a device for the implementation of the above-mentioned method.

BRIEF DESCRIPTION OF THE DRAWINGS

Other characteristics and advantages of the invention shall appear in the following description made with reference to the appended drawings of which.

MORE DETAILED DESCRIPTION

Figure 1:
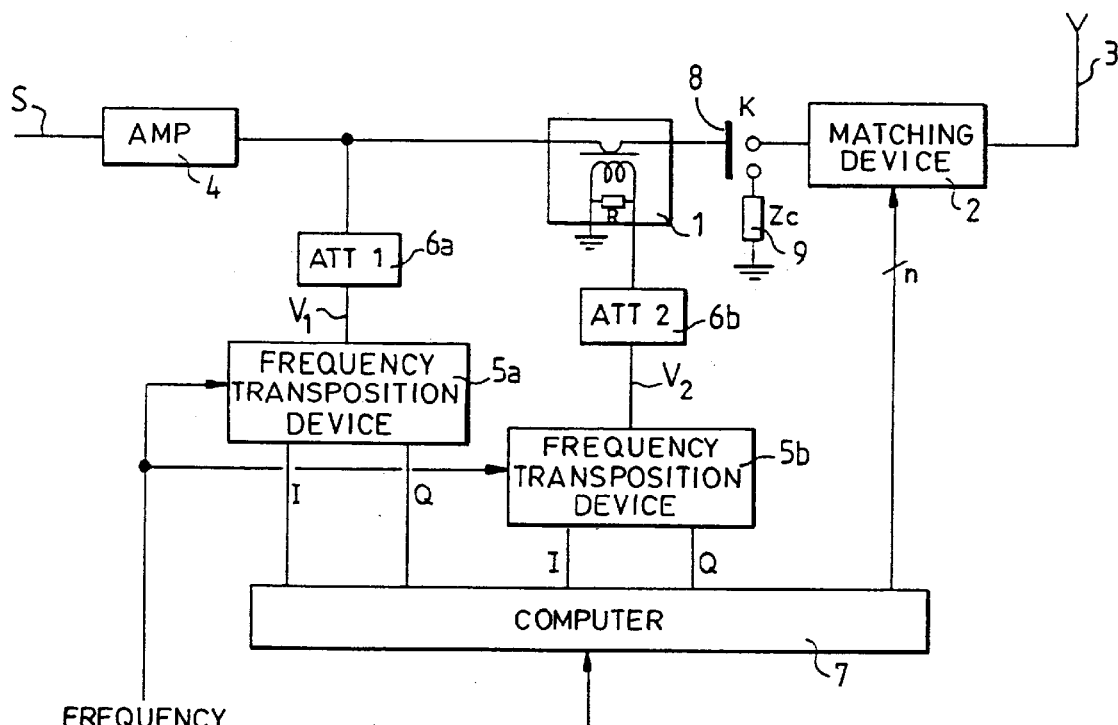
FIG. 1 shows an embodiment of an antenna impedance measurement device according to the invention.

The antenna impedance measurement device shown in FIG. 1 comprises a broadband current/voltage transformer 1 coupled by its primary winding between a matching device 2 of an antenna 3 and the output of a signal amplifier AMPLI 4 of signals S to be applied to the antenna 3. The measurement device also comprises two baseband digital frequency transposition devices 5a and 5b. Of these devices, 5a, is coupled to the output of the amplifier 4 and the other device, 5b, is coupled to the secondary winding of the transformer 1, respectively through attenuators ATT1 and ATT2, respectively referenced 6a and 6b. The two frequency transposition devices 5a and 5b have their outputs coupled respectively to inputs of a computation device 7 formed by a microprocessor or any equivalent device. The devices 5a and 5b split up the signal applied to their input into two quadrature signals I and Q. One signal 5a directly converts the voltage of the signal obtained at output of the amplifier 4, while the other converts the current of the signal obtained at the output of the amplifier 4 converted beforehand into voltage by the transformer 1.

The computation device 7 is programmed to compute the input impedance of the antenna 3 from the signals given on the two I and Q channels of the two frequency transposition devices 5a and 5b and to command the matching device 2 to match the impedance between the output of the amplifier 4 and the antenna 2. A calibrating device comprising a switch 8 and an impedance Zc is positioned between the transformer 1 and the matching device 2.

Figure 2:
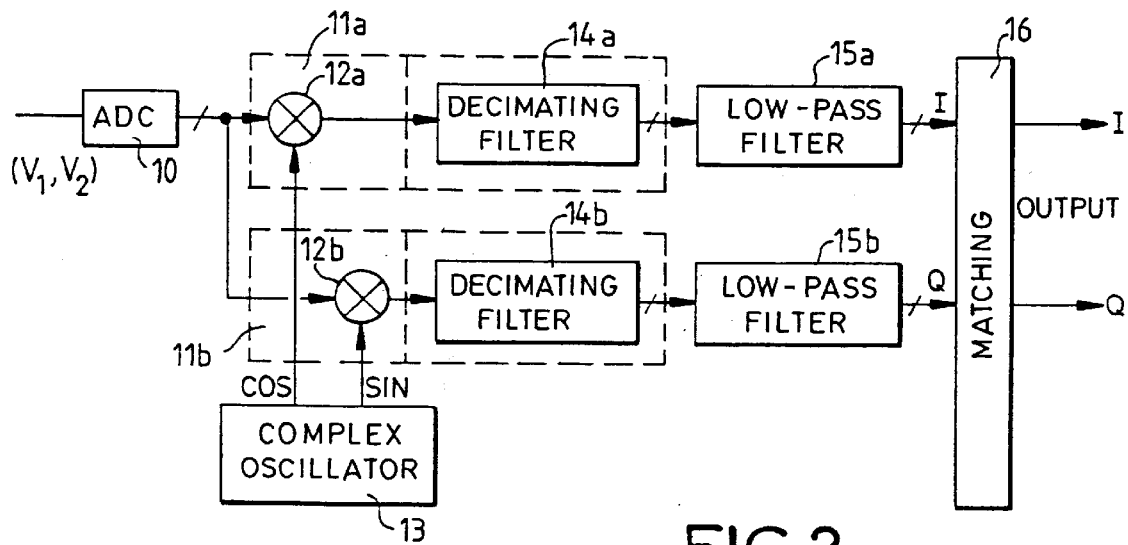
FIG. 2 shows a first exemplary implementation of the frequency transposition devices of FIG. 1.

The frequency transposition devices 5a and 5b have identical structures and are formed, as shown in FIG. 2, by an analog-digital converter ADC 10 coupled to a transposition chain made up of two quadrature channels 11a and 11b shown within two boxes of dashed lines. Each of the channels comprises a multiplier circuit 12a and 12b respectively, connected by a first input to the output of the digital-analog converter 10. The second inputs of the two multiplier circuits 12a and 12b are respectively connected to two quadrature outputs of a complex oscillator 13. The outputs of the two channels 11a and 11b are respectively coupled to the inputs of two decimating filters 14a and 14b followed by two finite impulse response low-pass filters 15a and 15b. An interface circuit 16 provides for the matching between the outputs of the two filters 15 and 15b and the computation device 7 of FIG. 1.

To measure the impedance Z of the antenna 3, it is first of all necessary to size the transformer 1 and the attenuators 6a and 6b so that the two voltages V1 and V2 given by the attenuators 6a and 6b, are equal when the primary winding of the transformer 1 is series-connected, through the switch 8, with a calibrating resistor Re that is selected with a value that is preferably equal to the characteristic impedance of the antenna 3. This adjustment standardizes the computation of the impedance Z of the antenna 3. The voltages V1 and V2 are then sampled simultaneously in phase and in quadrature by each analog-digital converter 10 and the multiplier circuits 12a, 12b so as to measure their modulus and their phase and compute the ratio of the moduli (Z) and the difference in phase φ by standardizing the results with respect to the calibrating resistor Re for the deduction therefrom of the real and reactive parts of the complex impedance of the antenna 3. This computation is done in application of the following relationships:

$$|Z| = Re. \frac{\sqrt{V_I^2 + V_Q^2}}{\sqrt{V_I'^2 + V_Q'^2}} = Re. \frac{V_1}{V_2} \quad (1)$$

-continued $$\varphi = \text{Arctan}\left[\frac{V_Q}{V_I}\right] - \text{Arctan}\left[\frac{V'_Q}{V'_I}\right] - \quad (2)$$
$$\pi\sin(V_I < 0) + \pi\text{sign}(V'_I < 0).$$

where $V_I$, $V_Q$; $V'_I$, $V'_Q$ respectively indicate the voltage levels of the samples provided by the frequency transposition devices on the I and Q channels, from which the real component R and imaginary component X of the impedance Z of the antenna 3 are deduced by the relationships:

$$R = R_E \cdot |Z| \cos(\varphi) \quad (3)$$

$$X = R_E \cdot |Z| \cdot \sin(\varphi) \quad (4)$$

Naturally the values of R and X obtained by the above computations may be considered to be exact only if we assume a perfect measurement device. Unfortunately, in practice, this is never likely to be the case, especially because of the transformer 1 which restores a signal whose amplitude and phase characteristics are variable according to the frequency and the environmental conditions, especially the temperature. It is therefore recommended to carry out a calibration whenever these parameters vary significantly.

In theory, the measurement can be done on only one pair of samples. In practice, it is preferable to take an average on several samples. This removes noise and parasites if any. A suitable sampling period may be chosen. This period may be in the range of about 5 ms for transmitters used in the HF band. In this case if we consider the stabilization time of the transmitter to be set at 5 ms, it can be seen that the measurement can be exploited within a time of 10 ms. This strongly diminishes the "signature" of the transmitter and amounts to a very short time when compared with the presently available devices where it is necessary to wait several hundreds of milliseconds to take a measurement of antenna impedance.

A second major advantage relates to the selectivity of the frequency converters which may be as good as 100 Hz. Thus the system is entirely protected against the jamming devices constituted by nearby transmitters.

A third advantage is constituted by the very low power (a few milliwatts) needed to take the measurement.

The device that has just been described is universal in its principle and can be adapted to the measurement of the real impedance of any passive electronic circuit.

Figure 3:
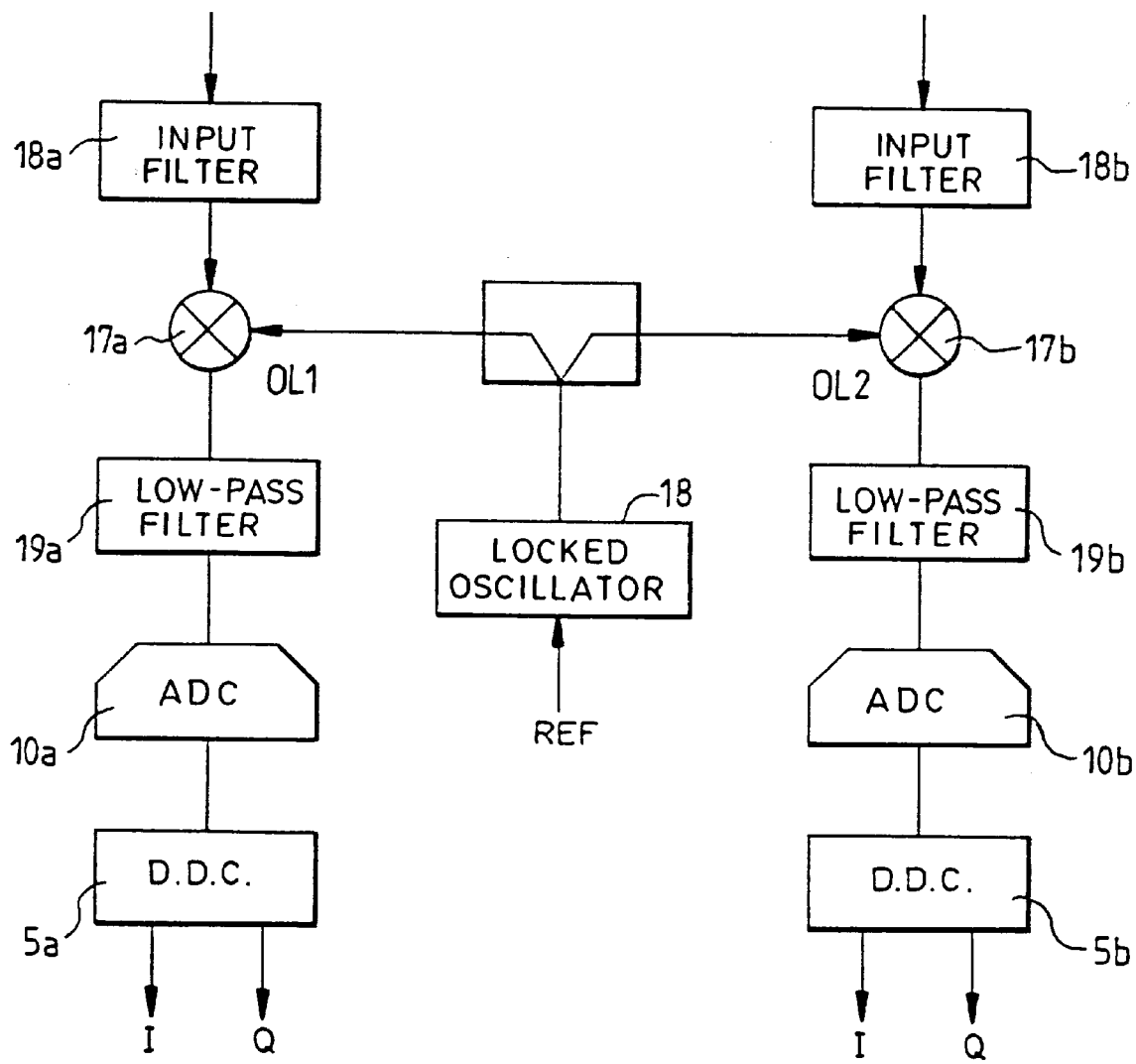
FIG. 3 a second exemplary implementation of the frequency transposition device of FIG. 1.

In practice the usable frequency band is limited to the bandwidth of the analog-digital converters. At present, the HF band is defined in the 1.5 to 30 MHz range, but the band of frequencies can be extended by modifying the frequency transposition devices in the manner shown in FIG. 3, where the elements similar to those of FIG. 1 are identified with the same references. In addition to the use, as in FIG. 1, of two channels each comprising an analog-digital converter 10a, 10b and a frequency transposition device 5a and 5b, a second frequency transposition device 17a, 17b is added on each channel, upline to the analog-digital converters 10a and 10b, and is interposed between two filters, one input filter 18a and one lowpass filter 19a, and 18b, 19b respectively. The need to place filters depends on the work frequency.

What is claimed is:

1. A method to measure the impedance of an antenna supplied by an amplifier, wherein the method consists of:
   the conversion, into voltage, of the value of the antenna supply current by means of a transformer whose primary winding is crossed by the supply current,
   the uncoupling, in a first step, of the antenna from the amplifier to charge the amplifier on a calibrating resistor Re through the primary winding of the transformer in making the voltage given by the secondary winding equal to the voltage given by the output of the amplifier,
   then the uncoupling, in a second step, of the calibrating resistor Re from the output of the amplifier by reconnecting the antenna to the output of the amplifier through the primary winding of the transformer to compute the modulus and the argument of impedance Z of the antenna through the multiplication, by the value of the calibrating resistor Re, of the ratio of the voltages given respectively during this second step by the output of the amplifier and the secondary winding of the transformer.

2. A method according to claim 1, consisting in sampling the signals obtained at the output of the amplifier and by the secondary winding of the transformer,
   distributing the samples on two quadrature channels,
   decimating, by one and the same ratio, the samples on each channel, and
   computing the ratio of the voltages and their phase shift from the decimated samples on the quadrature channels.

3. A device to measure the impedance of an antenna supplied by an amplifier, comprising a current/voltage transformer coupled by its primary winding between a matching device of the antenna and the output of the amplifier, a first and a second baseband digital frequency transposition device respectively coupled to the output of the amplifier and to the secondary winding of the transformer, and a computation device to compute the impedance of the antenna from signals given by the first frequency transposition device and the second frequency transposition device.

4. A device according to claim 3, wherein the first frequency transposition device and the second frequency transposition device have an identical structure, and comprise an analog/digital converter coupled to a transposition chain made up of two quadrature channels, each of the channels comprising a multiplier circuit, connected by a first input to the output of the digital-analog converter, the second inputs of the multiplier circuits being connected respectively to two quadrature outputs of a complex oscillator, the outputs of the two channels being respectively coupled to the inputs of two decimating filters followed by two finite impulse response low-pass filters and an interface circuit to match the outputs of the two filters to the computation device.

5. A device according to one of the claims 3 and 4, comprising a calibration device made up of a switch and a calibrating impedance Zc=Re positioned between the transformer and the matching device to switch over, in a calibrating phase, the primary winding of the transformer in series with the calibrating impedance and to switch over, in a transmission phase, the primary winding of the transformer to the antenna through the matching device.

6. A device according to claim 5, wherein the transformer 1 is sized so that the two voltages given by the output of the amplifier and the secondary winding of the transformer are equal in the calibration phase.

* * * * *